US007282971B2

(12) United States Patent
Panpalia et al.

(10) Patent No.: US 7,282,971 B2
(45) Date of Patent: Oct. 16, 2007

(54) DIGITAL DELAY LOCK LOOP

(75) Inventors: Ashish Panpalia, Maharashtra (IN); Puneet Sareen, Delhi (IN)

(73) Assignee: STMicroelectronics Pvt. Ltd., Noida (IN)

( * ) Notice: Subject to any disclaimer, the term of this patent is extended or adjusted under 35 U.S.C. 154(b) by 99 days.

(21) Appl. No.: 11/319,756

(22) Filed: Dec. 27, 2005

(65) Prior Publication Data

US 2006/0145741 A1    Jul. 6, 2006

(30) Foreign Application Priority Data

Dec. 30, 2004 (IN) .................. 2597/DEL/2004

(51) Int. Cl.
*H03L 7/06* (2006.01)

(52) U.S. Cl. ...................................... 327/149; 327/158

(58) Field of Classification Search ................ 327/149, 327/158, 160–161
See application file for complete search history.

(56) References Cited

U.S. PATENT DOCUMENTS

2001/0005337 A1* 6/2001 Jung ...................... 365/230.08
2005/0024107 A1* 2/2005 Takai et al. .................. 327/158
2006/0087353 A1* 4/2006 Minzoni et al. ............. 327/158

* cited by examiner

*Primary Examiner*—Quan Tra
*Assistant Examiner*—Rey Aranda
(74) *Attorney, Agent, or Firm*—Gardere Wynne Sewell LLP

(57) ABSTRACT

A digital delay locked loop architecture is independent of feedback delay (clock tree delay). The architecture employs a frequency detector circuit which monitors the frequency of the input clock and then sets a division factor for a reference clock used to control delay tap selection. In this way, the architecture can support a fast locking time, coarse tuning and fine-tuning.

12 Claims, 8 Drawing Sheets

DIGITAL DELAY LOCK LOOP

PRIORITY CLAIM

The present application claims priority from Indian Patent Application No. 2597/Del/2004 filed Dec. 30, 2004, as a provisional application, with a complete specification filed on Jun. 2, 2005, the disclosures of which are hereby incorporated by reference.

BACKGROUND OF THE INVENTION

1. Technical Field of the Invention

The present invention relates to a digital Delay Lock Loop (DLL) with an adaptable Clock Adjust Block for fast locking time.

2. Description of Related Art

Phase Locked Loops (PLL's) and Delay Locked Loops (DLL's) are very extensively employed in bigger chips like a System on Chip (SOC), a microprocessor, a memory, and the like, in order to cancel the on chip clock amplification and buffering delays, and improve the I/O timing margins. However, the increasing clock speeds and increasing levels of complexity in digital circuits create a hostile operating environment for the phase alignment circuits. The supply and substrate noise resulting from the switching of digital circuits can affect the PLL or DLL operation and result in output clock jitter that subtracts from the I/O timing margins.

For example, in Synchronous Dynamic Random Access Memory (SDRAM) applications, as frequencies approach 200 MHz, the inherent analog delay between an external system or reference clock and valid output data time is becoming a crucial constraint. Such a delay of, for example, 4-10 ns is large enough to make a following clock cycle overlap the data, i.e., the delay becomes large enough for data not to be ready at the output during one cycle, and it essentially becomes "off-sync". This inherent internal delay must therefore be accelerated according to the necessary frequency but in a controlled fashion. The problem translates into a synchronization task between the internal clock, which controls the output path, and the correct edge of the external clock.

Analog DLLs have been employed in the past to perform synchronization. Analog DLLs are comprised of a delay chain having delay of its elements varied by analog bias voltages supplied by a phase detector. In digital systems such as memories, microprocessors and application specific integrated circuits, these types of DLLs introduce analog design complications in a mainly digital design and therefore are avoided.

To overcome the above-mentioned complications, digital DLLs were developed which used a digitally adjustable delay line. Digital information is used to either include or exclude a certain number of delay elements within a delay chain. Although digital DLLs have a much higher jitter than analog DLLs, their ease of implementation in the digital system makes them a preferred solution in most digital applications.

In applications where no clock synthesis is required, DLLs offer an attractive alternative to PLLs due to their better jitter performance, inherent stability, and simpler design. The main disadvantage of conventional DLLs, however, is their limited phase capture range.

FIG. 1 shows simplified block diagram of digital DLL. The digital DLL includes a digital Coarse tuning section 10 receiving the external clock and control signals for generating a delayed output clock; a digital Fine tuning section 11 receiving control signals and the output of the digital Coarse tuning section 10 for further tuning; and a control block 12 receiving external and internal clock for generating control signals for configuring the tuning sections 10 and 11. These tuning sections 10 and 11 use variable delay chains containing a plurality of delay cells connected in series. Two distinct types of delay cells are used in these tuning sections 10 and 11 where each delay cell is exclusively used in a particular tuning block namely Coarse tuning section 10 and Fine-tuning section 11. The Coarse tuning section 10 contains delay cells with larger delays as compared to delay cells in the Fine-tuning section 11. The total delay of the delay chain in the Fine-tuning section 11 is equal to the delay of one delay cell in Coarse tuning section 10.

Each delay cell in these chains has an associated tap and this tap is used to select a specified delay, which is the sum of the delays of delay cells till the corresponding tap point. The tap selection for Coarse and Fine-tuning sections 10 and 11 is done by the Control block 12, which receives internal and external clock and produces control signals for tap selection in tuning sections. The external clock is used as the reference clock in this block. The control block uses ring counters and edge detection circuitry to generate the control signals for tap selection.

However, the inherent problem of this DLL setup comes into light when the clock tree delay is more than a clock period. In this case, the DLL will never be locked if the clock to the control block is same as the external clock. The problem is illustrated by using the example given in FIG. 2.

Consider a situation in which the clock tree delay is equal to 3 clock periods. Due to this delay, whichever tap is selected by the control block 12 its effect will be visible on the feedback clock only after 3 clock periods. Hence any decision (Right Shift/Left Shift/Lock) will be taken 3 clock periods after the tap is selected. But until that decision is taken 3 more taps would have been selected, as the control block counter would have counted 3 more clock cycles. This is a source of potential error. From the waveforms of FIG. 2 it is clear that any decision, which is taken with respect to the Feedback Clock corresponding to TAPx, will be reflected only when TAP (x+2) is selected. Hence, a correct decision will never be taken. The whole problem arises because the decision for the tap selection is taken before the feedback clock gives any indication. This tap selection is controlled by the control block 12, which is operating at the input clock frequency. Thus, if the clock to the Control block 12 is divided such that no further tap is selected till the output clock arrives at the feedback clock terminal, the problem is solved.

Prior art United States Published Application for Patent No. 2001/0005337, describes a DLL for use in a synchronous memory device. In this prior art reference, a fixed divider is used for the control clock and as a result, the DLL acts properly if the feedback delay is less than N clock cycles, where N is the division factor of the fixed divider. For a control clock operating at high frequency, this translates into an upper limit on delay allowed in terms of clock cycles. Another major drawback of the prior art DLL is seen at low clock frequency operation. At low clock frequency, the period of the clock is long and as a result, the clock tree delay may be less than one clock cycle. As a result, the fixed divider unnecessarily slows down the control block operation by introducing a control clock operating at even lower frequency. Slower control block operation results in an unnecessary slow down of the locking operation in DLL. In conclusion, an undesirable characteristic of the prior art DLL with a fixed divider is its dependence on the external clock frequency and the clock tree delay. It is also observed that the prior art uses significant hardware resources, which is undesirable in silicon implementation.

To obviate the aforesaid drawbacks a need exists to provide fast locking in digital DLL.

Another need is to provide an area efficient solution.

Yet another need is to remove the clock tree delay dependency.

SUMMARY OF THE INVENTION

Embodiments of the present invention overcome these drawbacks by utilizing an adaptable divider in the control block in which the division factor changes with the input clock frequency. The DLL architecture combines several techniques to achieve unlimited phase, capture range, low static-phase error, high operating frequencies and fast locking time. Further, the present invention results in an area efficient solution.

In accordance with an embodiment, a digital Delay Locked Loop (DLL) comprises: one or more sequences of delay elements providing multiple delayed outputs of an input clock; a selection means connected to the outputs of each of said sequences for selecting one of said outputs; and a control means for adjusting said selection means to provide the desired delay between said input clock and the output clock. An adaptive clock generator adjusts a reference clock in response to the delay between said input clock and said output clock; an edge detection means generates a control output based on the time difference between the corresponding edges of said input clock and said output clock with reference to a timing window; and said control means adjusts said selection means based on said adjusted reference clock and said control output, thereby achieving a wide phase capture range over higher frequencies with minimal lock time.

Said adaptive clock generator comprises: a first counter receiving said input clock and said output clock for generating an output signal; and a clock divider receiving said output signal and said input clock for generating said reference clock.

Said first counter comprises: a first latch receiving said output clock; a second latch receiving the output of said first latch at it reset input; a logic gate being connected to the output of said second latch and said input clock; and a second counter connected to the output of said logic gate for providing the counted value.

Said logic gate is an AND gate.

Said edge detection means comprises: a phase detector receiving said output clock and said input clock for generating a flag control signal to control coarse tuning; and a lock generator receiving said output clock, said input clock and said flag control signal for controlling fine tuning.

Said control means comprises: a first ring counter receiving a gated clock and output of said edge detection means for generating control signal for said selection means; a second ring counter receiving a gated clock and output of said edge detection means for generating control signal for said selection means; a clock generator block receiving output of said first ring counter for generating a clock signal for said second ring counter for the condition of overflow of said first ring counter; and a selector receiving the gated clock at its first input, output of said clock generator and a control signal for selecting between the said first input and said generated clock signal.

Said gated clock is an output of AND gate with clock signal as one input and inverted control signal from said edge detection means as another input.

In accordance with another embodiment, a method for providing digitally adjusted clock comprises the steps of: providing multiple delayed outputs of an input clock; selecting one output from said delayed outputs; and adjusting the delay between said input clock and the output clock to provide the desired delay. The method further comprises: adjusting a reference clock in response to the delay between said input clock and said output; generating a control output based on the time difference between the corresponding edges of said input clock and said output clock with reference to a timing window; and adjusting said selection based on said adjusted reference clock and said control output, thereby achieving a wide phase capture range over higher frequencies with minimal lock time.

Accordingly, embodiments of the present invention provide a delay locked loop architecture which is independent of feedback delay (clock tree delay). The architecture employs a frequency detector circuit, which monitors the frequency of input, clock and then sets the division factor for the clock going to the control block. To have fast locking time, coarse tuning and fine-tuning are employed.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
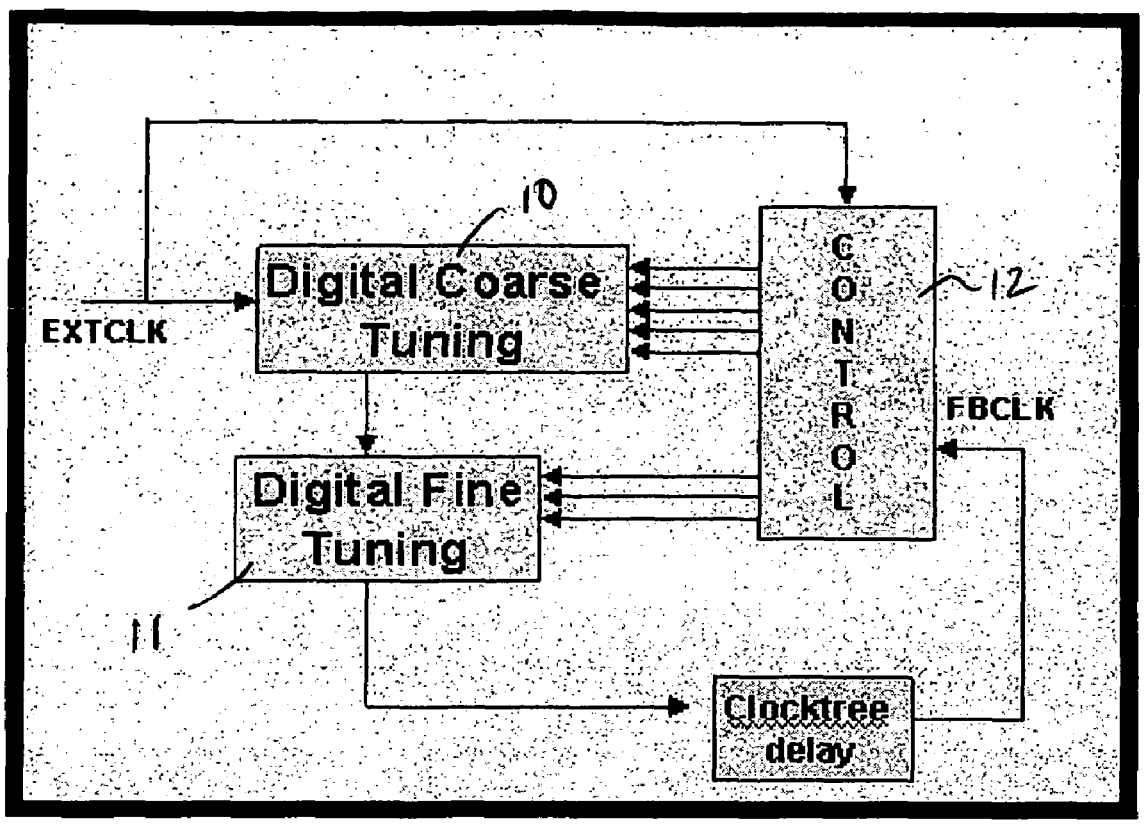
FIG. 1 shows the block diagram of a DLL with clock tree dependence.
Figure 2:
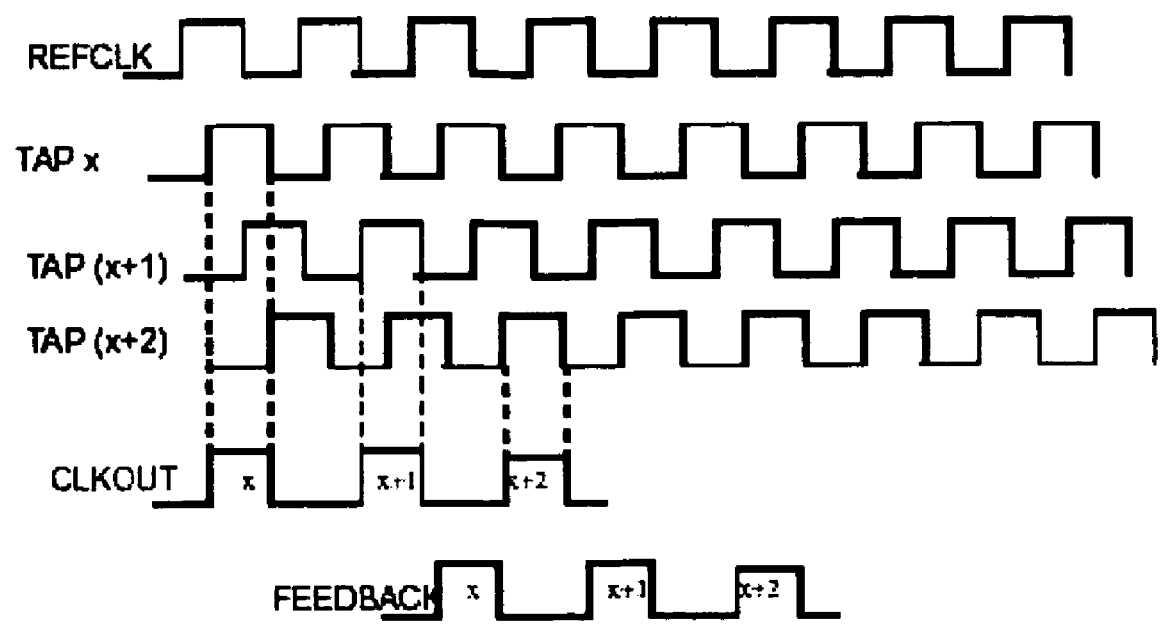
FIG. 2 shows the waveform showing Clock tree dependence.
Figure 3:
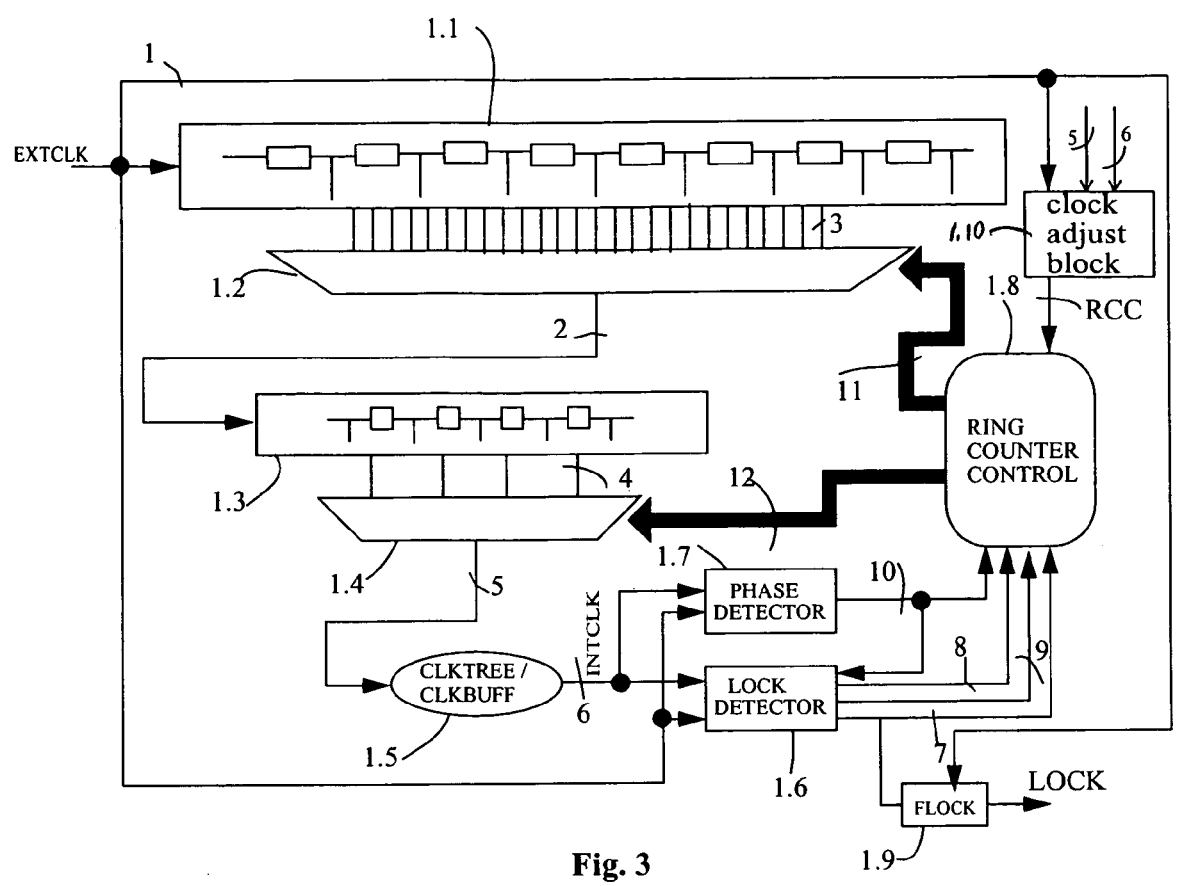
FIG. 3 shows the block diagram of a complete DLL in accordance with the invention.

FIG. 3 shows a block diagram of a complete DLL in accordance with an embodiment of the invention. The figure discloses a detector block 1.6, a ring counter control block 1.8, a clock adjust block 1.10, a clock tree buffer 1.5, two delay chains 1.1 and 1.3, multiplexers 1.2 and 1.4 and a FLOCK 1.9 connected to each other as shown in the diagram.

There are two stages of tuning employed to speed up the locking process. A first stage of tuning is coarse tuning while a second stage of tuning is fine-tuning. Phase detector 1.7 controls the coarse tuning while Lock Detector 1.6 controls the fine-tuning. Coarse tuning is achieved by block 1.1 which comprises a coarse delay chain, the length of which depends upon the minimum input frequency. Fine-tuning is done by fine-tuning delay chain 1.3. The total delay of fine-tuning delay chain 1.3 is divided into a number of delay cells and is equal to the delay of one delay cell in coarse tuning delay chain 1.1. It can be divided into a number depending upon the resolution/accuracy requirements. The Ring Counter control block 1.8 controls the selection of TAPs, both in coarse tuning as well as fine-tuning.

Initially, the output of Phase detector 1.7 is zero and the first tap of the TAPs 3 (of Delay 1.1) is selected, more precisely, the output from first coarse delay cell is selected. The Control block 1.8 operates at every rising edge of the clock RCC and a next tap is selected. The process continues until the output 10 of Phase Detector 1.7 is high. Until the output of Phase Detector 1.7 is zero, the first tap of the TAPs 4 (of Delay 1.3) is selected. The Phase Detector 1.7 output remains low until the rising edge of INTCLK 6 crosses the rising edge of EXTCLK 1. As soon as it happens, the output 10 goes high. The moment output 10 goes high, it disables the clock to the Coarse Tuning Ring Counter, enables Lock Detector 1.6 and provides a clock to the Fine Tuning Ring Counter.

Figure 4:
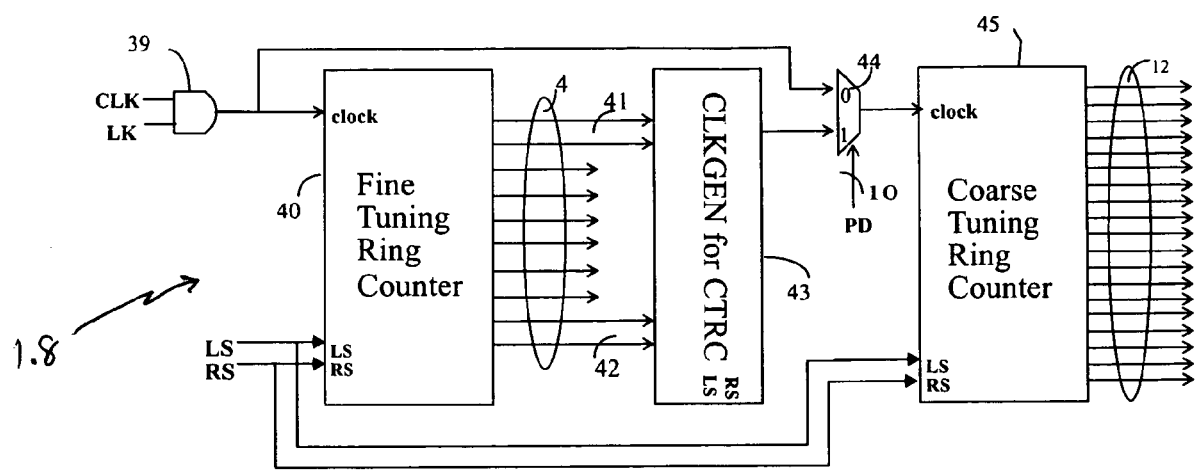
FIG. 4 shows the circuit of a Ring Counter Control in accordance with the invention.

FIG. 4 shows the Ring Counter Control (1.8), which comprises of two ring counters 40 and 45 with one bit being circulated in each ring counter, a Clock Generator 43 for Coarse Tuning Ring Counter 45 and a multiplexer 44. Fine Tuning Ring Counter 40 controls fine tuning TAPs 4 and the Coarse Tuning Ring Counter 45 controls coarse tuning TAPs 3. The counters 40 and 45 used could be UP counters or DOWN counters. When LS is high, the counters are in the left shift mode and when RS is high are in right shift mode. The PD signal comes from Phase Detector block 1.7. When PD is low then counter gets direct clock CLK. The Clock Generator 43 generates a clock signal in case an overflow condition arises while fine tuning.

Figure 5:
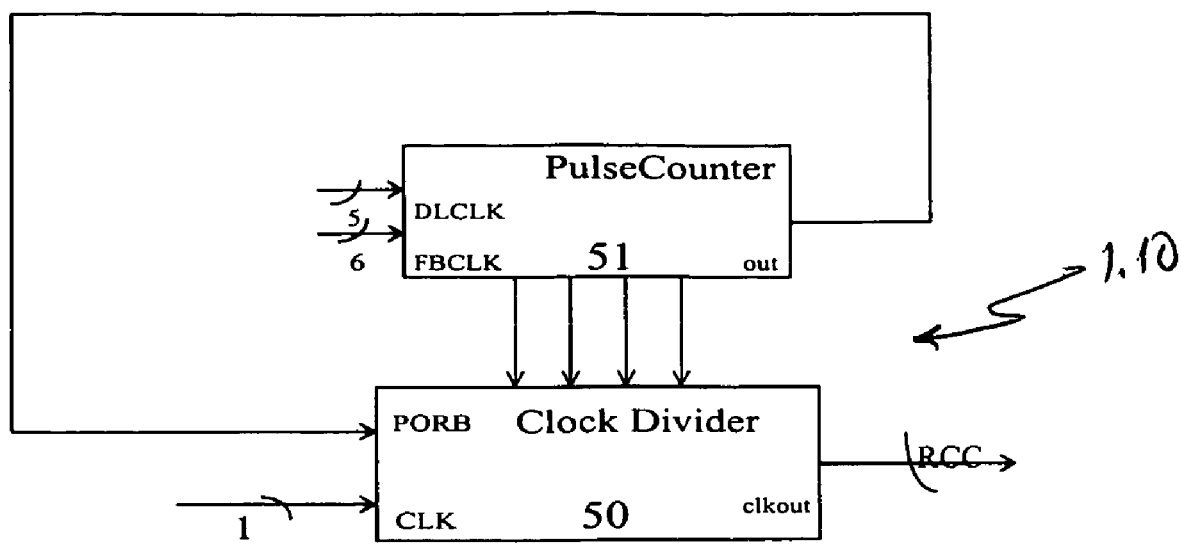
FIG. 5 shows the circuit of a clock adjust block in accordance with the invention.

FIG. 5 shows a Clock Adjust block 1.10. The Clock Adjust Block 1.10 mainly comprises of a Programmable Divide By N counter 50 (discussed later) and a Pulse Counter Circuit 51. The outputs of the clock tree as well as the DLL (input of clock tree) are fed to Pulse Counter Block 51. Pulse Counter 51 is a circuit, which measures the delay of the clock tree. It counts the number of pulses of the CLKOUT of DLL before the first pulse of Feedback Clock arises. This way it measures the delay of the clock tree. This count is then loaded into the Programmable Divide By N Counter 50, which divides the input clock by the count. This divided count is then input to the Control Block as a clock 1.8. Thus, the Clock Adjust Block 1.10 divides the frequency of the input clock by the factor, which is proportional to the delay of the clock tree.

Figure 6:
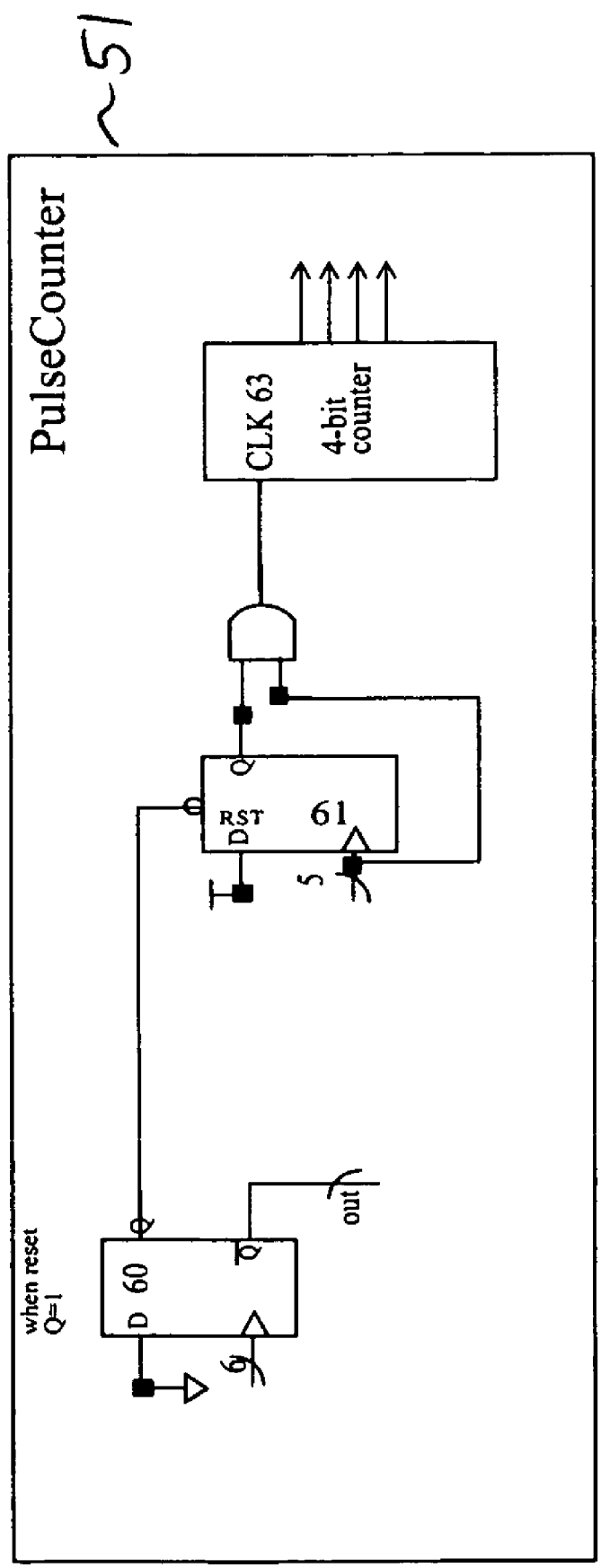
FIG. 6 shows the circuit of a Pulse Counter in accordance with the invention.

The Pulse Counter 51 shown in FIG. 6 consists of two flip-flops 60 and 61, a 4-bit counter 63 and an AND gate 62. While signal clock 6 is low, the output Q of the flip-flop 61 is high and output of AND gate 62 is same as the clock signal 5. As clock signal 6 goes high, the output Q of flip-flop 60 goes high. This output Q of flip-flop 61 is connected to the reset node resulting in output Q of flip-flop 61 going low and disabling the clock signal to the counter 63. As a result, the 4-bit counter 63 starts at the first rising edge of 5 and ends at the first rising edge of 6. This way it measures the delay in terms of clock period. This count is fed to the clock divider 50 and the output divided clock is fed to the control block 1.8.

Figure 7:
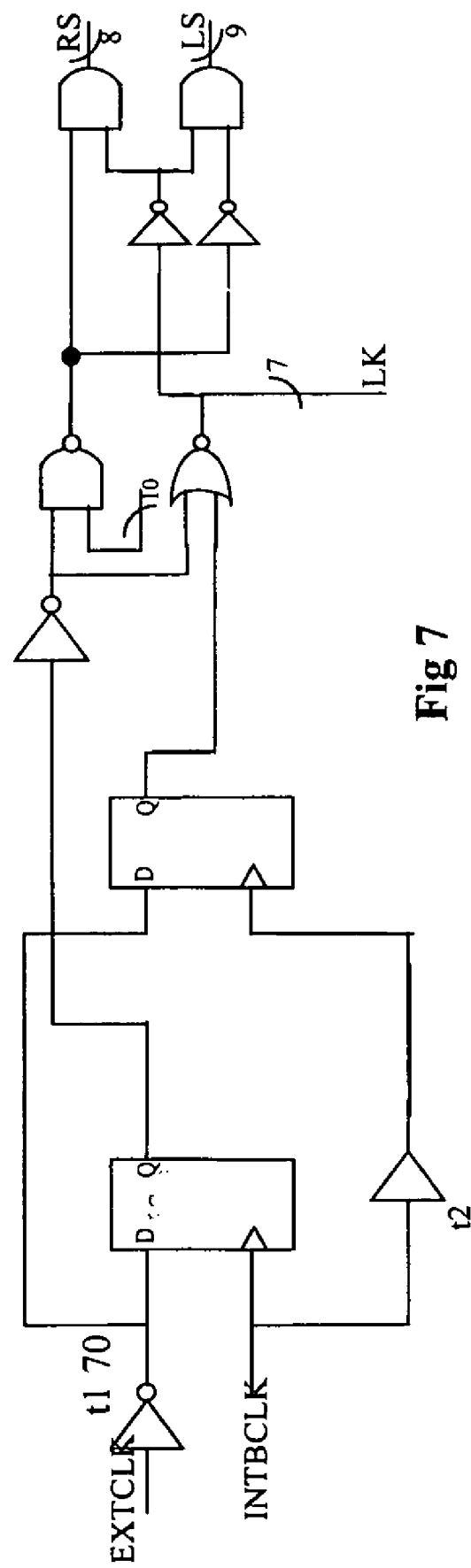
FIG. 7 shows the circuit of a Lock Detector in accordance with the invention.

FIG. 7 shows the circuit of a Lock Detector. It comprises of two flip-flops 71 and 72, and plurality of logic gates 70, 73 to 79 connected to each other as shown in the diagram. The external clock EXTCLK is connected to the inverter 70 while the signal INTCLK acts as a clock for the flip-flop 71.

The flip-flop 72 receives the delayed INTCLK via buffer 73 with t2 delay. The Fine-Tuning Counter is controlled by the outputs of Lock Detector 1.6, which generates three outputs 'LS', 'RS', & 'LK'. In this block, t1 & t2 set the window around INTCLK as shown in FIG. 8.1.

Figure 8:
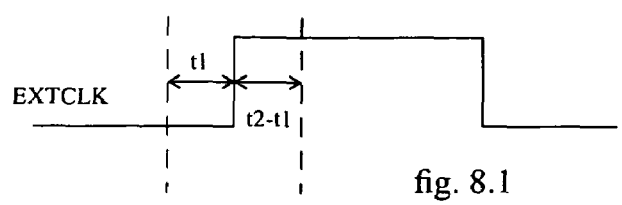
FIGS. 8.1 to 8.4 show the waveform of a Lock Detector in accordance with the invention.
Figure 8:
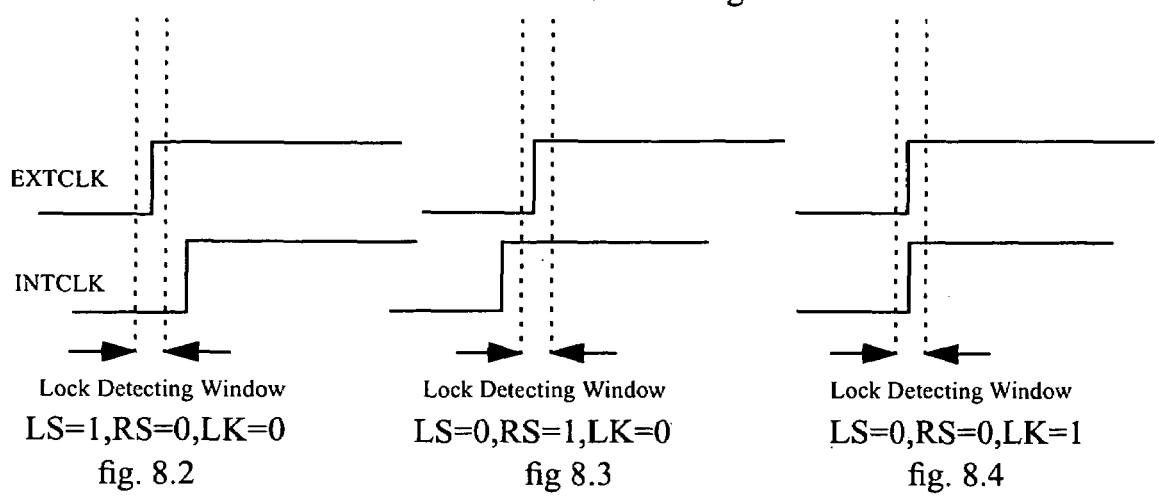

The conditions of the rising edge of INTCLK and EXTCLK signals are generated as described in FIGS. 8.2, 8.3 and 8.4. In this block, a window is generated around the rising edge of EXTCLK. When the rising edge of 6 is inside that window, LK is high and LS and RS are low. When the rising edge of 6 is towards the left side of window, then RS is high and other two are low, and when rising edge of 6 is towards the right side of EXTCLK, then LS is high and other two are low. When LK is high, clock to the Fine-Tuning Counter is disabled. If RS is high, then at the positive edge of the reference clock RCC, the next TAP will be selected and the delay increases. If LS is high, then at the positive edge of the reference clock RCC, previous TAP will be selected and as a result, delay decreases.

Example: Let us take an example of the case where total feedback delay is more than one clock cycle of the input clock. In this example, the Input frequency 500 MHz and the clock period=2 ns. The Total feedback delay (including clock tree)=5 ns. The Delay Chain Delay step=0.25 ns. The Number of control clock cycles required to lock=25 (including fine tuning).

Using conventional DLL's, with a fixed divider (divide by 4) for DLL control, for 500 MHz operation the Number of cycles to lock=25*4=100, the Time to lock=100*2=200 ns. For 100 MHz operation, the Time to lock=100*10=1000 ns.

Using the present Invention, for 500 MHz operation, the Division Factor for DLL Control=3, the Number of cycles to lock=25*3=75, and the Time to lock=75*2=150 ns. For 100 MHz operation, the Division factor for DLL Control=1, the Number of cycles to lock=25*1=25, and the Time to lock=25*10=250 ns.

As shown in the above example, the present invention has a faster locking time as compared to the prior art. It is also seen that the present invention uses significantly less hardware in terms of logic gates, delay lines and other hardware circuitry, resulting in an area efficient architecture. Further the aforesaid architecture suitably adjusts to the input clock frequency and is independent of clock tree delay.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A digital Delay Locked Loop (DLL) comprising:
   one or more sequences of delay elements providing multiple delayed outputs of an input clock;
   selection means connected to the outputs of each of said sequences of delay elements for selecting one of said outputs as an output clock;
   control means for adjusting said selection means to provide the desired delay between said input clock and the output clock;
   an adaptive clock generator for adjusting a reference clock in response to the delay between said input clock and said output clock;
   edge detection means for generating a control output based on a time difference between corresponding edges of said input clock and said output clock with reference to a timing window; and wherein said control means adjusts said selection means based on said adjusted reference clock and said control output, thereby achieving a wide phase capture range over higher frequencies with minimal lock time.

2. The digital DLL as in claim 1 wherein said adaptive clock generator comprises:
   a first counter receiving said input clock and said output clock for generating an output signal; and
   a clock divider receiving said output signal and said input clock for generating said reference clock.

3. The digital DLL as in claim 2 wherein said first counter comprises:
   a first latch receiving said output clock;
   a second latch receiving the output of said first latch at it reset input;
   a logic gate being connected to the output of said second latch and said input clock; and
   a second counter connected to the output of said logic gate for providing the counted value.

4. The digital DLL as in claim 3 wherein said logic gate is an AND gate.

5. The digital DLL as in claim 1 wherein said edge detection means comprises:
   a phase detector receiving said output clock and said input clock for generating a flag control signal to control coarse tuning; and
   a lock detector receiving said output clock, said input clock and said flag control signal for controlling fine tuning.

6. The digital DLL as in claim 1 wherein said control means comprises:
   a first ring counter receiving a gated clock and output of said edge detection means for generating control signal for said selection means;
   a second ring counter receiving a gated clock and output of said edge detection means for generating control signal for said selection means;
   a clock generator block receiving output of said first ring counter for generating a clock signal for said second ring counter for the condition of overflow of said first ring counter; and
   a selector receiving the gated clock at its first input, output of said clock generator and a control signal for selecting between the said first input and said generated clock signal.

7. The digital DLL as in claim 6 wherein said gated clock is an output of AND gate with clock signal as one input and inverted control signal from said edge detection means as another input.

8. A method for providing digitally adjusted clock comprising the steps of:
   providing multiple delayed outputs of an input clock;
   selecting one output from said delayed outputs as an output clock; and
   adjusting the delay between said input clock and the output clock to provide the desired delay;
   adjusting a reference clock in response to the delay between said input clock and said output;
   generating a control output based on the time difference between the corresponding edges of said input clock and said output clock with reference to a timing window; and
   adjusting said selection based on said adjusted reference clock and said control output, thereby achieving a wide phase capture range over higher frequencies with minimal lock time.

9. A circuit, comprising:
   a first multi-tap delay receiving an external clock;
   a first multiplexer whose inputs are taps from the first multi-tap delay and having a first output;
   a second multi-tap delay having an input coupled to the output of the first multiplexer;
   a second multiplexer whose inputs are taps from the second multi-tap delay and having a second output;
   a clocktree coupled to the second output;
   a phase detector comparing an output of the clock tree to the external clock;
   a lock detector comparing an output of the clock tree to the external clock;
   a control circuit operable responsive to the output of the phase detector and lock detector for controlling tap selection by the first and second multiplexers.

10. The circuit of claim 9 wherein the phase detector outputs a signal indicative of course tuning and the control circuit controls selection of a certain tap of the first multi-tap delay in response thereto.

11. The circuit of claim 10 wherein the lock detector outputs a signal indicative of fine tuning and the control circuit controls selection of a certain tap of the second multi-tap delay in response thereto.

12. The circuit of claim 9 further including a clock adjust circuit which measures a delay of the clocktree and divides the external clock by the clocktree delay to produce a reference clock used by the control circuit in making tap selections.

* * * * *